United States Patent
Chen

(10) Patent No.: US 8,525,179 B2
(45) Date of Patent: Sep. 3, 2013

(54) THIN FILM TRANSISTOR AND FABRICATING METHOD THEREOF

(75) Inventor: Chang-Ken Chen, Taipei County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 13/084,581

(22) Filed: Apr. 12, 2011

(65) Prior Publication Data

US 2012/0056180 A1    Mar. 8, 2012

(30) Foreign Application Priority Data

Sep. 3, 2010   (TW) .............................. 99129890 A

(51) Int. Cl.
*H01L 29/04*    (2006.01)
(52) U.S. Cl.
USPC .................................. 257/66; 257/52; 257/59
(58) Field of Classification Search
USPC ........................ 257/57, 66, E29.003, 52, 59
See application file for complete search history.

(56) References Cited

U.S. PATENT DOCUMENTS

| 6,214,684 B1 * | 4/2001 | Shoji ............................. 438/308 |
| 7,259,110 B2 | 8/2007 | Ohnuma et al. |
| 7,847,295 B2 * | 12/2010 | Nagata et al. ................... 257/72 |

FOREIGN PATENT DOCUMENTS

JP    09-116162    5/1997

* cited by examiner

*Primary Examiner* — Tran Tran
(74) *Attorney, Agent, or Firm* — Jianq Chyun IP Office

(57) ABSTRACT

A thin film transistor including a substrate, a semiconductor layer, a patterned doped semiconductor layer, a source and a drain, a gate insulation layer, and a gate is provided. The semiconductor layer is disposed on the substrate. The patterned doped semiconductor layer is disposed on opposite sides of the semiconductor layer. The source and the drain are disposed on the patterned doped semiconductor layer and the opposite sides of the semiconductor layer, wherein a part of the semiconductor layer covered by the source and the drain has a first thickness, a part of the semiconductor layer disposed between the source and the drain and not covered by the source and the drain has a second thickness ranging from 200 Å to 800 Å. The gate insulation layer is disposed on the source, the drain and the semiconductor layer. The gate is disposed on the gate insulation layer.

8 Claims, 4 Drawing Sheets

US 8,525,179 B2

THIN FILM TRANSISTOR AND FABRICATING METHOD THEREOF

CROSS-REFERENCE TO RELATED APPLICATION

This application claims the priority benefit of Taiwan application serial no. 99129890, filed Sep. 3, 2010. The entirety of the above-mentioned patent application is hereby incorporated by reference herein and made a part of this specification.

BACKGROUND OF THE INVENTION

1. Field of the Invention

The invention relates to a semiconductor device and a fabricating method thereof, and more particularly to a thin film transistor and a fabricating method thereof.

2. Description of Related Art

Along with the maturation of photoelectrical technology and semiconductor fabrication technology, flat displays have been developed vigorously. Flat displays have gradually replaced the conventional cathode ray tube (CRT) displays and become the mainstream of display products recently for the advantages of low voltage operation, free of radiation scattering, light weight, and compact volume. Generally, liquid crystal displays (LCDs) can be categorized into amorphous silicon thin film transistors (TFT) and low temperature polysilicon TFTs.

Having higher carrier mobility and device stability, low temperature polysilicon TFTs can be widely applied in product design. However, as the development progresses to large-sized panels, low temperature polysilicon TFTs is limited to its fabrication temperature and the specification of the machine, and thus cannot be applied in large-sizes panels. For example, in the fabrication of low temperature polysilicon TFTs, doped regions have to be formed by implantation. Nevertheless, the specification of the conventional implantation machines fails to incorporate the fabrication of large-sized panels to form low temperature polysilicon TFTs. In contrast, the fabrication of amorphous silicon TFTs satisfies the demands for large area production. As a consequence, the combination of the polysilicon fabrication and the amorphous silicon fabrication is proposed for fabricating polysilicon TFTs. For instance, crystallized parts of the polysilicon TFTs are formed by crystallization methods such as the solid phase crystallization (SPC), and the remaining parts are completed in the assembly line of the amorphous silicon TFTs to prevent the use of doping machines. As shown from experiments, the structural properties of the polysilicon TFTs formed by the method aforementioned are affected by the etching process performed to the channel layer, and the device characteristics are evidently affected by the structure of the channel layer.

SUMMARY OF THE INVENTION

The invention is directed to a thin film transistor (TFT) and a fabricating method thereof, so that the TFT has superior device characteristics.

The invention provides a thin film transistor including a substrate, a semiconductor layer, a patterned doped semiconductor layer, a source and a drain, a gate insulation layer, and a gate. The semiconductor layer is disposed on the substrate. The patterned doped semiconductor layer is disposed on opposite sides of the semiconductor layer. The source and the drain are disposed on the patterned doped semiconductor layer and on the opposite sides of the semiconductor layer. A part of the semiconductor layer covered by the source and the drain has a first thickness. A part of the semiconductor layer located between the source and the drain and not covered by the source and the drain has a second thickness ranging from 200 Å to 800 Å. The gate insulation layer is disposed on the source, the drain and the semiconductor layer. The gate is disposed on the gate insulation layer.

The invention further provides a fabricating method of a TFT. A semiconductor layer having a first thickness is formed on a substrate. A patterned doped semiconductor layer is formed on the semiconductor layer. A source and a drain are formed on the patterned doped semiconductor layer. The source and the drain are disposed on opposite sides of the semiconductor layer, wherein a part of the semiconductor layer located between the source and the drain and not covered by the source and the drain has a second thickness ranging from 200 Å to 800 Å. A gate insulation layer is formed on the source and the drain to cover the source and the drain, the patterned doped semiconductor layer, and the semiconductor layer. A gate is formed on the gate insulation layer.

In light of the foregoing, in the TFT of the invention, a part of the semiconductor layer located between the source and the drain and not covered by the source and the drain has a thickness ranging from 200 Å to 800 Å, so that the TFT has superior device characteristics.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

First Embodiment

Figure 1A:
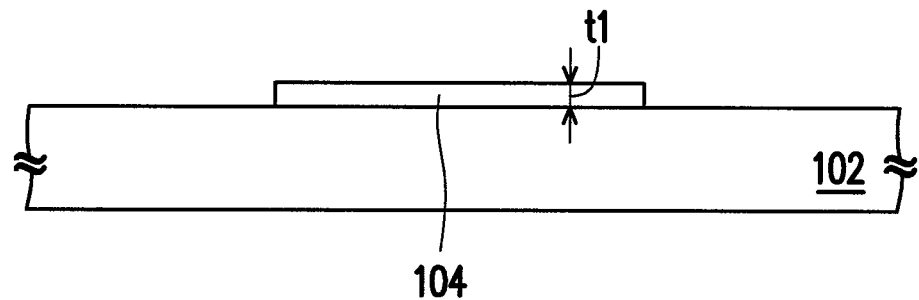
FIGS. 1A to 1D are schematic cross-sectional diagrams showing a flow chart of a fabricating method of a thin film transistor (TFT) according to a first embodiment of the invention.

FIGS. 1A to 1D are schematic cross-sectional diagrams showing a flow chart of a fabricating method of a thin film transistor (TFT) according to a first embodiment of the invention. Referring to FIG. 1A, a semiconductor layer 104 having a first thickness t1 is formed on a substrate 102. In the present embodiment, the substrate 102 is a glass substrate, a quartz substrate, or a substrate of other material, and the invention is not limited thereto. The semiconductor layer 104 is, for example, a polysilicon layer formed by a deposition method or a crystallization method. In the present embodiment, an amorphous silicon layer (not shown) is formed on the substrate 102, for example. The amorphous silicon layer is transformed into a polysilicon layer through a crystallization method such as a solid phase crystallization (SPC) method, an excimer laser annealing (ELA) method, and so on. Here, the first thickness t1, for instance, ranges from 200 Å to 800 Å, and preferably ranges from 300 Å to 400 Å.

Figure 1B:
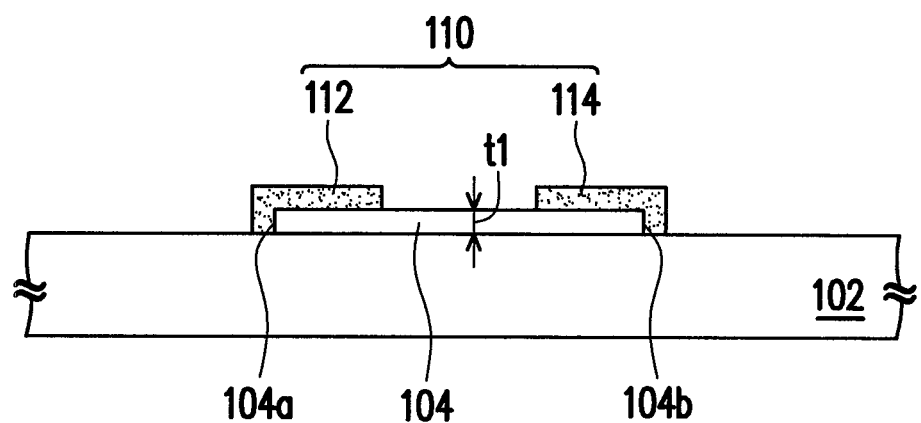

Referring to FIG. 1B, a patterned doped semiconductor layer 110 is formed on the semiconductor layer 104. In the present embodiment, the patterned doped semiconductor layer 110 is formed by, for instance, the following. A doped semiconductor material layer (not shown) is formed on the semiconductor layer 104. A part of the doped semiconductor material layer is removed to form the patterned doped semiconductor layer 110. In the present embodiment, the patterned doped semiconductor layer 110, for instance, includes an N-type dopant and is formed by a deposition method or a doping process. For example, the patterned doped semiconductor layer 110 is, for example, an N-type doped amorphous silicon layer and formed by a chemical vapor deposition (CVD) method, for example. As shown in FIG. 1B, the patterned doped semiconductor layer 110 includes, for instance, a first doped semiconductor layer 112 and a second doped semiconductor layer 114. The first doped semiconductor layer 112 covers, for example, a first side surface 104a of the semiconductor layer 104. The second doped semiconductor layer 114 covers, for example, a second side surface 104b of the semiconductor layer 104. The first side surface 104a and the second side surface 104b are located at opposite sides of the semiconductor layer 104. It should be noted that although the doped semiconductor material layer is formed by using a deposition method in the present embodiment, in another embodiment, a semiconductor material layer can be first formed on the semiconductor layer 104, where the semiconductor material layer is performed with a doping process to form a doped semiconductor material layer. In other words, the patterned doped semiconductor layer 110 can be formed by any conventional methods and the invention is not limited thereto.

Figure 1C:
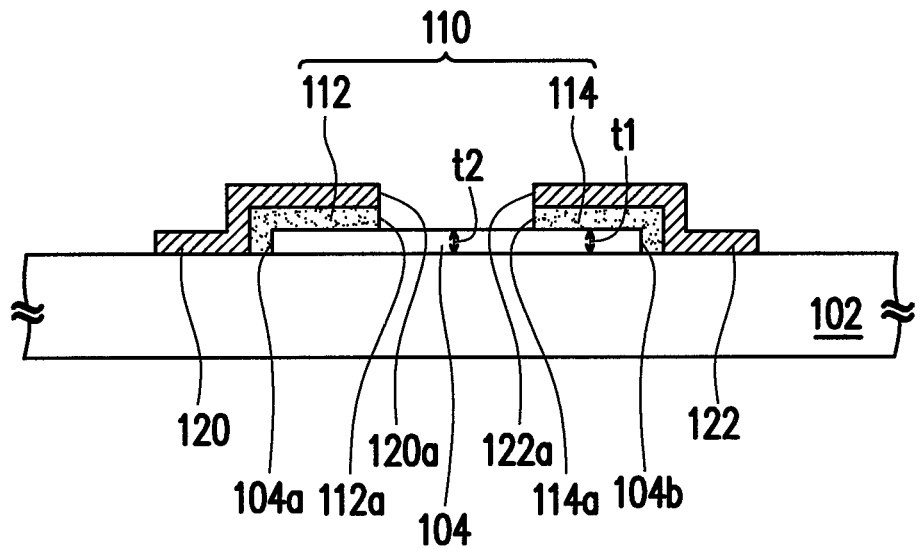

Referring to FIG. 1C, a source 120 and a drain 122 are formed on the patterned doped semiconductor layer 110. The source 120 and the drain 122 are disposed on the opposite sides of the semiconductor layer 104. A part of the semiconductor layer 140 located between the source 120 and the drain 122 and not covered by the source 120 and the drain 122 has a second thickness t2 ranging from 200 Å to 800 Å. In the present embodiment, a conductor layer (not shown) is formed on the patterned doped semiconductor layer 110 and then patterned to form the source 120 and the drain 122 on the opposite sides of the semiconductor layer 104 and expose the semiconductor layer 104 located between the source 120 and the drain 122. The source 120 and the drain 122 are fabricated with, for example, titanium, aluminum, molybdenum, and a combination thereof, or other conductive material. The source 120 and the drain 122 are formed by a physical vapor deposition (PVD) method, for example. In the present embodiment, an inner side edge 112a of the first doped semiconductor layer 112 and an inner side edge 120a of the source 120 are, for example, substantially aligned. Moreover, an inner side edge 114a of the second doped semiconductor layer 114 and an inner side edge 122a of the drain 122 are, for instance, substantially aligned. In another embodiment, a doped semiconductor material layer (not shown) is formed on the semiconductor layer 104. A conductor layer (not shown) is formed on the doped semiconductor material layer. The conductor layer and the doped semiconductor material layer are simultaneously patterned with the same photomask (not shown), and the invention is not limited thereto.

In the present embodiment, after the semiconductor layer 104 is formed, a part of the semiconductor layer 104 is not removed. Thus, the semiconductor layer 104 generally has an even thickness. That is, a part of the semiconductor layer 104 located between the source 120 and the drain 122 and not covered by the source 120 and the drain 122 has the same thickness as a part of the semiconductor layer 104 covered by the source 120 and the drain 122. Therefore, the second thickness t2 generally equals to the first thickness t1 and the second thickness preferably ranges from 300 Å to 400 Å.

Figure 1D:
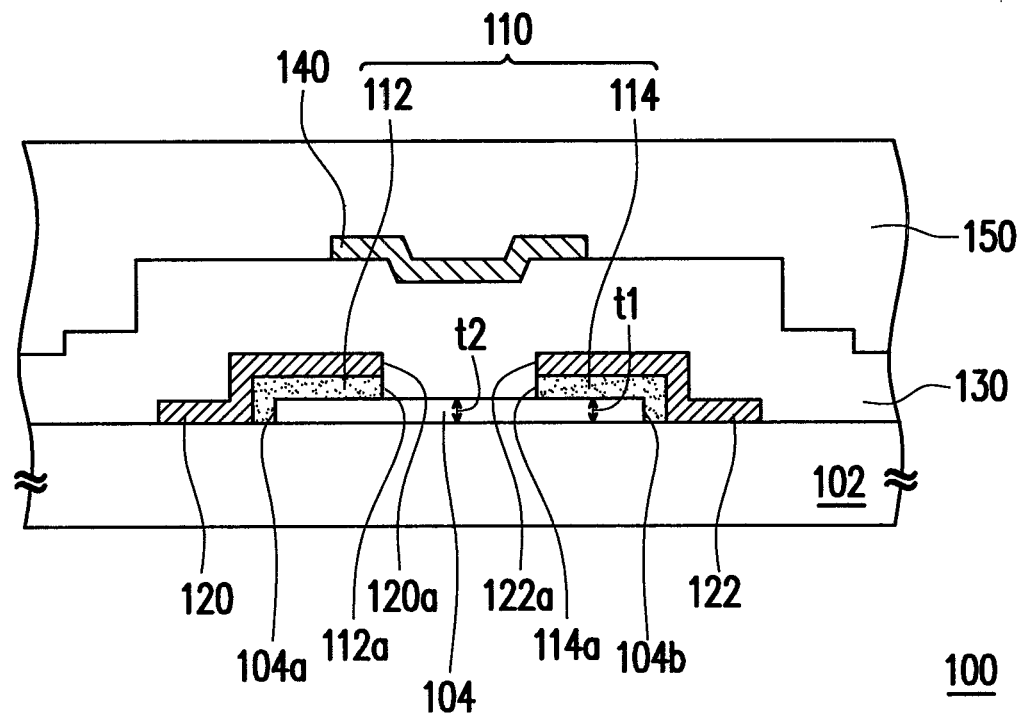

Referring to FIG. 1D, a gate insulation layer 130 is formed on the source 120 and the drain 122 to cover the source 120, the drain 122, and the semiconductor layer 104. The gate insulation layer 130 is, for example, fabricated with silicon oxide, silicon nitride, or other insulation material, and formed by a CVD method, for example. A gate 140 is formed on the gate insulation layer 130. The gate 140 is fabricated with, for example, titanium, aluminum, molybdenum, and a combination thereof, or other conductive material. The gate 140 is formed by a PVD method, for example. An insulation layer 150 is formed on the gate 140 to cover the gate 140, the gate insulation layer 130, the source 120 and the drain 122, and the semiconductor layer 104. The insulation layer 150 is, for example, fabricated with silicon oxide, silicon nitride, or other insulation material, and formed by a CVD method, for example.

In the present embodiment, a TFT 100 includes the substrate 102, the semiconductor layer 104, the patterned doped semiconductor layer 110, the source 120 and the drain 122, the gate insulation layer 130, the gate 140, and the insulation layer 150. The semiconductor layer 104 is disposed on the substrate 102. The patterned doped semiconductor layer 110 is disposed on the opposite sides of the semiconductor layer 104. The patterned doped semiconductor layer 110, for example, includes an N-type dopant. The patterned doped semiconductor layer 110, for instance, includes the first doped semiconductor layer 112 and the second doped semiconductor layer 114. The first doped semiconductor layer 112 is, for example, located between the semiconductor layer 104 and the source 120 and covers the first side surface 104a of the semiconductor layer 104. The second doped semiconductor layer 114 is, for instance, located between the semiconductor layer 104 and the drain 122 and covers the second side surface 104b of the semiconductor layer 104. The first side surface 104a and the second side surface 104b are located at the opposite sides of the semiconductor layer 104. In the present embodiment, the inner side edge 112a of the first doped semiconductor layer 112 and the inner side edge 120a of the source 120 are, for example, substantially aligned. Moreover, the inner side edge 114a of the second doped semiconductor layer 114 and the inner side edge 122a of the drain 122 are, for instance, substantially aligned. In other embodiments, the inner side edge 112a of the first doped semiconductor layer 112 and the inner side edge 120a of the source 120 are, for example, not aligned. Or, the inner side edge 114a of the second doped semiconductor layer 114 and the inner side edge 122a of the drain 122 are, for instance, not aligned.

The source 120 and the drain 122 are disposed on the patterned doped semiconductor layer 110 and on the opposite sides of the semiconductor layer 104. A part of the semiconductor layer 104 covered by the source 120 and the drain 122 has the first thickness t1. A part of the semiconductor layer 104 located between the source 120 and the drain 122 and not covered by the source 120 and the drain 122 has a second thickness t2 ranging from 200 Å to 800 Å. In the present embodiment, the semiconductor layer 104 has an even thickness, for example. That is, the second thickness t2 generally equals to the first thickness t1. In other words, the thickness t1 of the semiconductor layer 104 covered by the source 120 and the drain 122 generally equals to the thickness t2 of the semiconductor layer 104 located between the source 120 and the drain 122 and not covered by the source 120 and the drain 122. The first thickness t1 and the second thickness t2 range, for example, from 300 Å to 400 Å. The gate insulation layer 130 is disposed on the source 120, the drain 122 and the semiconductor layer 104. The gate 140 is disposed on the gate insulation layer 130. The insulation layer 150 is disposed on the gate 140 and the gate insulation layer 130 to cover the gate 140, the gate insulation layer 130, the source 120 and the drain 122, and the semiconductor layer 104.

In general, the thickness of the semiconductor layer adopted as a channel layer affects the device characteristics of the TFT. Thus, in the fabrication method of the TFT 100 of the present embodiment, the thickness of the semiconductor layer 104 is maintained from 200 Å to 800 Å in the formation of the semiconductor layer 104, such that the thickness of the semiconductor layer 104 located between the source 120 and the drain 122 and not covered by the source 120 and the drain 122 ranges from 200 Å to 800 Å. As shown in experiments, when the thickness of the semiconductor layer 104 not covered by the source 120 and the drain 122 ranges from 200 Å to 800 Å, the TFT 100 has superior device characteristics. In the present embodiment, the patterned doped semiconductor layer 110 is formed by a deposition method such as a CVD method, so that a doping machine is not required for forming the patterned doped semiconductor layer 110. Therefore, the fabrication of the TFT 100 is not limited to the specification of the doping machine and can be incorporated with the conventional amorphous silicon TFT fabrication. In other words, the TFT and the fabricating method thereof allow the TFT to have superior device characteristics and satisfy the demands for large area production to fabricate a TFT that can be adopted in large-sized panels, so as to enhance the display quality of the panel.

Second Embodiment

Figure 2A:
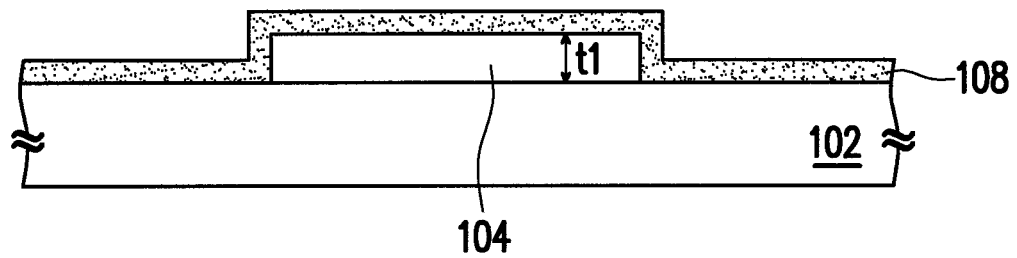
FIGS. 2A to 2D are schematic cross-sectional diagrams showing a flow chart of a fabricating method of a TFT according to a second embodiment of the invention.
Figure 2B:
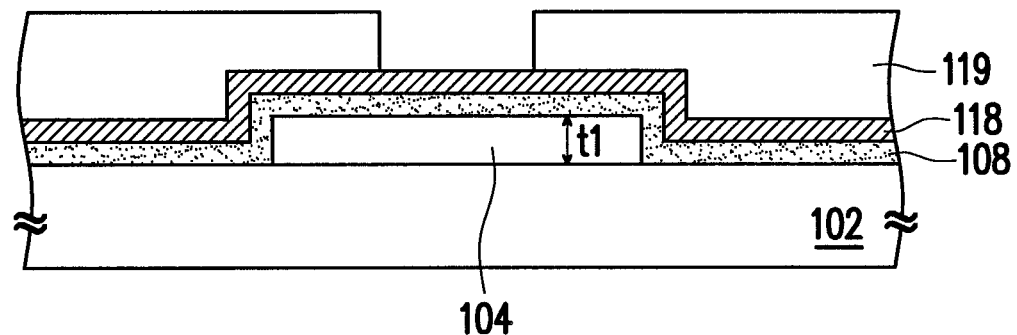

FIGS. 2A to 2D are schematic cross-sectional diagrams showing a flow chart of a fabricating method of a TFT according to a second embodiment of the invention. Referring to FIG. 2A, a semiconductor layer 104 having a first thickness t1 is formed on a substrate 102. In the present embodiment, the substrate 102 is a glass substrate, a quartz substrate, or a substrate of other material. The semiconductor layer 104 is, for example, a polysilicon layer formed by a deposition method or a crystallization method. In the present embodiment, an amorphous silicon layer (not shown) is formed on the substrate 102, for example. The amorphous silicon layer is transformed into a polysilicon layer through a crystallization method such as a SPC method, an ELA method, and so on. The first thickness t1, for example, ranges from 300 Å to 2000 Å.

Referring to FIG. 2A, a doped semiconductor material layer 108 is formed on the semiconductor layer 104. For example, the doped semiconductor material layer 108 is, for example, an N-type doped amorphous silicon layer and formed by a CVD method, for example. A conductor layer 118 is formed on the doped semiconductor material layer 108. The conductor layer 118 is fabricated with, for example, titanium, aluminum, molybdenum, and a combination thereof, or other conductive material. The conductor layer 118 is formed by a PVD method, for example. A patterned mask layer 119 is formed on the conductor layer 118. The patterned mask layer 119 covers opposite sides of the semiconductor layer 104. In another embodiment, the doped semiconductor material layer 108 and the conductor layer 118 are not defined simultaneously using the same patterned mask layer, and the invention is not limited thereto.

Figure 2C:
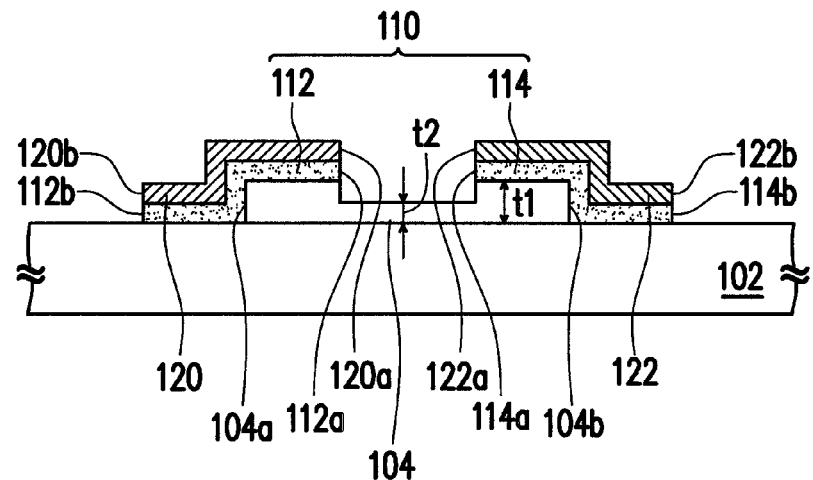

Referring to FIG. 2C, the patterned mask layer 119 is used as a mask to remove a part of the conductor layer 118 and a part of the doped semiconductor material layer 108 so as to form a source 120, a drain 122, and a patterned doped semiconductor layer 110. In the present embodiment, after a part of the conductor layer 118 and a part of the doped semiconductor material layer 108 are removed, a part of the semiconductor layer 104 not covered by the source 120 and the drain 122 is further removed, so that a part of the semiconductor layer 104 not covered by the source 120 and the drain 122 has a second thickness t2 ranging from 200 Å to 800 Å. Hence, the semiconductor layer 104 covered by the source 120 and the drain 122 has the first thickness t1, the semiconductor layer 104 located between the source 120 and the drain 122 and not covered by the source 120 and the drain 122 has the second thickness t2.

In addition, the first thickness t1 is generally greater than the second thickness t2. A part of the conductor layer 118 and a part of the doped semiconductor material 108 are removed by, for instance, performing a dry etching process or a wet etching process, or performing a wet etching process followed by a dry etching process. The patterned mask layer 119 is then removed. It should be noted that in the present embodiment, the patterned mask layer 119 is adopted as a mask to remove a part of the doped semiconductor material layer 108 to form the patterned doped semiconductor layer 110. However, in another embodiment, the patterned mask layer 119 can be removed after the source 120 and the drain 122 are formed. Then, by using the source 120 and the drain 122 as masks, a part of the doped semiconductor material layer 108 is removed to form the patterned doped semiconductor layer 110.

In the present embodiment, the patterned doped semiconductor layer 110 includes, for instance, a first doped semiconductor layer 112 and a second doped semiconductor layer 114. Since the source 120, the drain 122, and the patterned doped semiconductor layer 110 are all formed by using the patterned mask layer 119 as a mask, an inner side edge 112a of the first doped semiconductor layer 112 and an inner side edge 120a of the source 120 are substantially aligned, for example, and an inner side edge 114a of the second doped semiconductor layer 114 and an inner side edge 122a of the drain 122 are, for instance, substantially aligned. An outer side edge 112b of the first doped semiconductor layer 112 and an outer side edge 120b of the source 120 are, for example, substantially aligned. Moreover, an outer side edge 114b of the second doped semiconductor layer 114 and an outer side edge 122b of the drain 122 are, for instance, substantially aligned. The first doped semiconductor layer 112 is, for example, located between the semiconductor layer 104 and the source 120 and covers a first side surface 104a of the semiconductor layer 104. The second doped semiconductor layer 114 is, for instance, located between the semiconductor layer 104 and the drain 122 and covers a second side surface 104b of the semiconductor layer 104. The first side surface 104a and the second side surface 104b are located at the opposite sides of the semiconductor layer 104. In another embodiment, the source 120 and the drain 122 do not cover the side surfaces of the semiconductor layer 104. That is, the outer side edge of the source 120 and the outer side edge of the drain 122 are substantially aligned to the side surfaces of the semiconductor layer 104 (not shown).

Figure 2D:
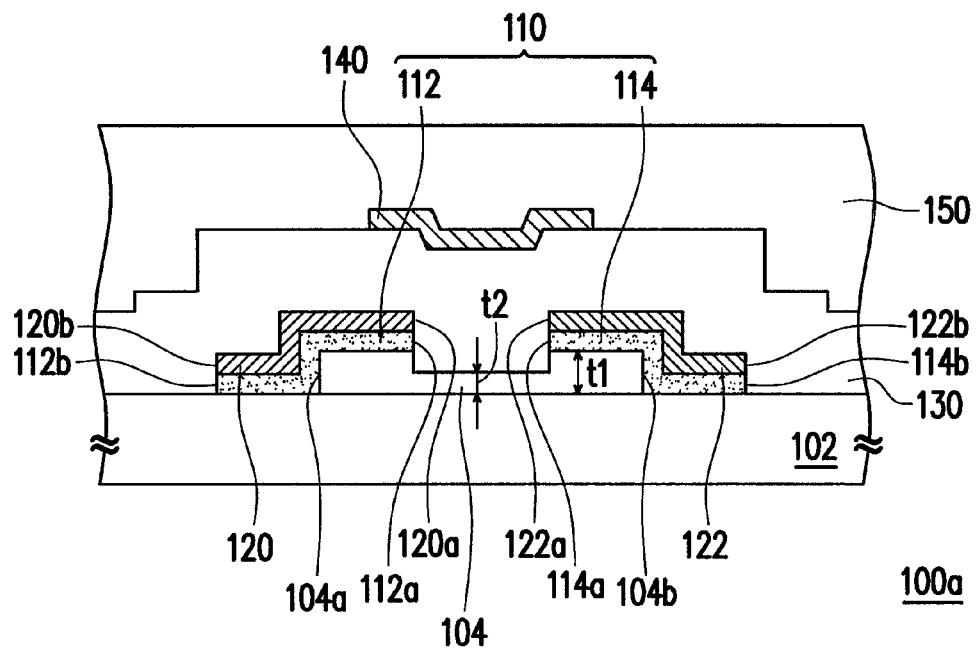

Referring to FIG. 2D, a gate insulation layer 130 is formed on the source 120 and the drain 122 to cover the source 120, the drain 122, and the semiconductor layer 104. A gate 140 is formed on the gate insulation layer 130. An insulation layer 150 is formed on the gate 140 to cover the gate 140, the gate insulation layer 130, the source 120 and the drain 122, and the semiconductor layer 104. The material and the fabricating method of the gate insulation layer 130, the gate 140, and the insulation layer 150 can be referred to those described in first embodiment and thus omitted hereinafter.

In the present embodiment, a TFT 100a includes the substrate 102, the semiconductor layer 104, the patterned doped semiconductor layer 110, the source 120 and the drain 122, the gate insulation layer 130, the gate 140, and the insulation layer 150. The semiconductor layer 104 is disposed on the substrate 102. The patterned doped semiconductor layer 110 is disposed on the opposite sides of the semiconductor layer 104. The patterned doped semiconductor layer 110, for example, includes an N-type dopant. The patterned doped semiconductor layer 110, for instance, includes the first doped semiconductor layer 112 and the second doped semiconductor layer 114. The first doped semiconductor layer 112 is, for example, located between the semiconductor layer 104 and the source 120 and covers the first side surface 104a of the semiconductor layer 104. The second doped semiconductor layer 114 is, for instance, located between the semiconductor layer 104 and the drain 122 and covers the second side surface 104b of the semiconductor layer 104. The first side surface 104a and the second side surface 104b are located at the opposite sides of the semiconductor layer 104. In the present embodiment, the inner side edge 112a of the first doped semiconductor layer 112 and the inner side edge 120a of the source 120 are, for example, substantially aligned. Moreover, the inner side edge 114a of the second doped semiconductor layer 114 and the inner side edge 122a of the drain 122 are, for instance, substantially aligned. The outer side edge 112b of the first doped semiconductor layer 112 and the outer side edge 120b of the source 120 are, for example, substantially aligned. Moreover, the outer side edge 114b of the second doped semiconductor layer 114 and the outer side edge 122b of the drain 122 are, for instance, substantially aligned.

The source 120 and the drain 122 are disposed on the patterned doped semiconductor layer 110 and on the opposite sides of the semiconductor layer 104. A part of the semiconductor layer 104 covered by the source 120 and the drain 122 has the first thickness t1. A part of the semiconductor layer 104 located between the source 120 and the drain 122 and not covered by the source 120 and the drain 122 has a second thickness t2 ranging from 200 Å to 800 Å. In the present embodiment, the first thickness t1 is generally greater than the second thickness t2. That is, the thickness t1 of the semiconductor layer 104 covered by the source 120 and the drain 122 is generally greater than the thickness t2 of the semiconductor layer 104 located between the source 120 and the drain 122 and not covered by the source 120 and the drain 122. The first thickness t1 ranges, for example, from 300 Å to 2000 Å. The second thickness t2 ranges from 300 Å to 400 Å, for example. The gate insulation layer 130 is disposed on the source 120, the drain 122 and the semiconductor layer 104. The gate 140 is disposed on the gate insulation layer 130. The insulation layer 150 is disposed on the gate 140 and the gate insulation layer 130 to cover the gate 140, the gate insulation layer 130, the source 120 and the drain 122, and the semiconductor layer 104.

In general, in the process of removing the doped semiconductor material layer 108 and the conductor layer 118 to form the patterned doped semiconductor layer 110 and the source 120 and the drain 122, the semiconductor layer 104 (that is, the channel layer) not covered by the source 120 and the drain 122 can also be removed simultaneously, such that the device characteristics of the TFT are affected. Consequently, in the present embodiment, the process of removing the semiconductor layer 104 is monitored for the semiconductor layer 104 not covered by the source 120 and the drain 122 to have a thickness ranging from 200 Å to 800 Å. As a result, the TFT 100a has superior device characteristics. In the present embodiment, the patterned doped semiconductor layer 110 is formed by a deposition method such as a CVD method, so that a doping machine is not required for forming the patterned doped semiconductor layer 110. Therefore, the fabrication of the TFT 100a is not limited to the specification of the doping machine and can be incorporated with the conventional amorphous silicon TFT fabrication. In other words, the TFT and the fabricating method thereof allow the TFT to have superior device characteristics and satisfy the demands for large area production to fabricate a TFT that can be adopted in large-sized panels, so as to enhance the display quality of the panel.

It should be noted that although the TFTs 100, 100a having structures shown in FIGS. 1D and 2D, and the fabricating methods thereof are illustrated as examples in the embodiments aforementioned, the invention is not limited thereto. In other words, the TFT of the invention and the concept of the fabricating method thereof allow the thickness of the semiconductor layer not covered by the source and the drain to range from 200 Å to 800 Å. As a consequence, the TFT and the fabricating method thereof in the invention can be applied in TFTs having other structures. For instance, although the first thickness t1 is generally equal to the second thickness t2 in the TFT 100 shown in FIG. 1D, in another embodiment, the first thickness t1 can also be generally greater than the second thickness t2 in a TFT having a structure depicted in FIG. 1D. Herein, the second thickness t2 of the semiconductor layer not covered by the source and the drain ranges from 200 Å to 800 Å. Similarly, in another embodiment, in a TFT having a structure shown in FIG. 2D, the first thickness t1 can also be generally equal to the second thickness t2. Here, the thickness t2 of the semiconductor layer not covered by the source and the drain ranges from 200 Å to 800 Å.

In summary, in the TFT of the invention, a part of the semiconductor layer located between the source and the drain and not covered by the source and the drain has a thickness ranging from 200 Å to 800 Å, so that the TFT has superior device characteristics. In one embodiment, in the formation of the semiconductor layer, the thickness of the semiconductor layer is maintained from 200 Å to 800 Å, such that the semiconductor layer of the TFT has an even thickness. In other words, the semiconductor layer located between the source and the drain and not covered by the source and the drain, and the semiconductor covered by the source and the drain substantially have the same thickness. The thickness ranges from 200 Å to 800 Å, and preferably ranges from 300 Å to 400 Å. In another embodiment, after the source and the drain are formed, by removing a part of the semiconductor layer not covered by the source and the drain, a part of the semiconductor layer not covered by the source and the drain has a thickness ranging from 200 Å to 800 Å, and preferably ranging from 300 Å to 400 Å. As a result, the TFT has superior device characteristics.

Notably, the formation of the TFT in the invention can be incorporated with the conventional fabrication of amorphous silicon TFTs to fabricate the top-gate polysilicon TFT. Here, the amorphous silicon layer is transformed into the polysilicon layer through a crystallization method such as a SPC method. Moreover, the patterned doped semiconductor layer is formed by using a deposition method such as a CVD method, so that the fabrication of the TFT omits the use of a doping machine. Therefore, the TFT and the fabricating method thereof in the invention allow the TFT to have superior device characteristics and satisfy the demands for large area production to fabricate a TFT that can be adopted in large-sized panels, so as to enhance the display quality of the panel.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A thin film transistor, comprising:
   a substrate;
   a semiconductor layer, disposed on the substrate;
   a patterned doped semiconductor layer, disposed on opposite sides of the semiconductor layer;
   a source and a drain, disposed on the patterned doped semiconductor layer and on the opposite sides of the semiconductor layer, wherein a part of the semiconductor layer covered by the source and the drain has a first thickness, and a part of the semiconductor layer located between the source and the drain and not covered by the source and the drain has a second thickness ranging from 400 Å to 800 Å;
   a gate insulation layer, disposed on the source and the drain and the semiconductor layer; and
   a gate, disposed on the gate insulation layer.

2. The thin film transistor as claimed in claim 1, wherein the semiconductor layer comprises a polysilicon layer.

3. The thin film transistor as claimed in claim 1, wherein the patterned doped semiconductor layer comprises an N-type amorphous silicon layer.

4. The thin film transistor as claimed in claim 1, wherein the patterned doped semiconductor layer comprises a first doped semiconductor layer and a second doped semiconductor layer, the first doped semiconductor layer is located between the semiconductor layer and the source and covers a first side surface of the semiconductor layer, and the second doped semiconductor layer is located between the semiconductor layer and the drain and covers a second side surface of the semiconductor layer, wherein the first side surface and the second side surface are located at the opposite sides of the semiconductor layer.

5. The thin film transistor as claimed in claim 4, wherein an inner edge of the first doped semiconductor layer and an inner edge of the source are substantially aligned, and an inner edge of the second doped semiconductor layer and an inner edge of the drain are substantially aligned.

6. The thin film transistor as claimed in claim 5, wherein an outer edge of the first doped semiconductor layer and an outer edge of the source are substantially aligned, and an outer edge of the second doped semiconductor layer and an outer edge of the drain are substantially aligned.

7. The thin film transistor as claimed in claim 1, wherein the first thickness is substantially greater than the second thickness.

8. The thin film transistor as claimed in claim 1, wherein the first thickness is substantially equal to the second thickness.

* * * * *